US010788539B2

(12) United States Patent
Miura et al.

(10) Patent No.: US 10,788,539 B2
(45) Date of Patent: Sep. 29, 2020

(54) BATTERY MONITORING DEVICE AND BATTERY SYSTEM USING SAME

(71) Applicant: HITACHI AUTOMOTIVE SYSTEMS, LTD., Hitachinaka-shi, Ibaraki (JP)

(72) Inventors: Hikaru Miura, Hitachinaka (JP); Akihiko Kudoh, Hitachinaka (JP); Mutsumi Kikuchi, Hitachinaka (JP); Tomonori Kanai, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 178 days.

(21) Appl. No.: 14/784,440

(22) PCT Filed: Apr. 26, 2013

(86) PCT No.: PCT/JP2013/062394
§ 371 (c)(1),
(2) Date: Oct. 14, 2015

(87) PCT Pub. No.: WO2014/174669
PCT Pub. Date: Oct. 30, 2014

(65) Prior Publication Data
US 2016/0169976 A1    Jun. 16, 2016

(51) Int. Cl.
*G01R 31/396* (2019.01)
*G01R 31/3835* (2019.01)
(Continued)

(52) U.S. Cl.
CPC .......... *G01R 31/396* (2019.01); *B60L 3/0069* (2013.01); *B60L 58/10* (2019.02);
(Continued)

(58) Field of Classification Search
CPC ............. G01R 31/3658; G01R 31/362; H01M 10/482; H02J 7/0016
(Continued)

(56) References Cited

U.S. PATENT DOCUMENTS 6,255,826 B1 * 7/2001 Ohsawa .................. B60K 6/28
324/426
7,257,010 B2 * 8/2007 Takahashi ............. H02M 7/219
363/126

(Continued)

FOREIGN PATENT DOCUMENTS

DE        9415874.6 U1    12/1994
EP        2325919 A2       5/2011
(Continued)

OTHER PUBLICATIONS

European Search Report for European Patent Application No. 13882790.2 dated Dec. 14, 2016.

*Primary Examiner* — David V Henze-Gongola
*Assistant Examiner* — Tarikh Kanem Rankine
(74) *Attorney, Agent, or Firm* — Volpe and Koenig, P.C.

(57) ABSTRACT

Provided are a battery monitoring device capable of suppressing a current flowing to individual battery cells and enhancing the safety thereof, even when there is a short circuit, for example, in a connection line connecting substrates having integrated circuits mounted thereon and a substrate having a microcomputer mounted thereon or a connection line connecting the substrates having the integrated circuits mounted thereon, and a battery system using the same. Resistors are provided in a positive electrode input line 13a connecting a positive electrode side of a battery pack group 200 and a total voltage detecting unit 13 and/or a negative electrode input line 13b connecting a negative electrode side of the battery pack group 200 and the total voltage detecting unit 13 and the resistors of the positive (Continued)

electrode input line 13a and/or negative electrode input line 13b are arranged on individual cell monitoring circuit boards 31 and 32.

4 Claims, 3 Drawing Sheets

(51) Int. Cl.

| | | |
|---|---|---|
| *B60L 3/00* | (2019.01) | |
| *H02J 7/00* | (2006.01) | |
| *B60L 58/20* | (2019.01) | |
| *B60L 58/10* | (2019.01) | |
| *G01R 19/00* | (2006.01) | |
| *G01R 31/36* | (2020.01) | |
| *H01M 10/42* | (2006.01) | |

(52) U.S. Cl.
CPC .......... *B60L 58/20* (2019.02); *G01R 31/3835* (2019.01); *H02J 7/0021* (2013.01); *H02J 7/0026* (2013.01); *B60L 2240/547* (2013.01); *G01R 19/0084* (2013.01); *G01R 31/36* (2013.01); *H01M 10/425* (2013.01); *H02J 7/0016* (2013.01); *Y02T 10/7005* (2013.01); *Y02T 10/7055* (2013.01); *Y02T 10/7066* (2013.01)

(58) Field of Classification Search
USPC ........................................................ 324/434
See application file for complete search history.

(56) References Cited

U.S. PATENT DOCUMENTS

| | | | | |
|---|---|---|---|---|
| 7,471,065 | B2* | 12/2008 | Emori ................. | B60L 11/1855 320/116 |
| 8,283,892 | B2* | 10/2012 | Miyazaki ............. | H02J 7/0026 320/116 |
| 2002/0011820 | A1* | 1/2002 | Suzuki ................. | H02J 7/0014 320/132 |
| 2002/0070707 | A1* | 6/2002 | Sato .................... | H01M 10/425 320/134 |
| 2002/0195994 | A1* | 12/2002 | Perelle ................ | B60L 3/0046 320/116 |
| 2005/0077878 | A1* | 4/2005 | Carrier ................ | B25F 5/00 320/134 |
| 2005/0242776 | A1* | 11/2005 | Emori ................. | H02J 3/38 320/116 |
| 2007/0024240 | A1* | 2/2007 | Morita ................ | G01R 31/374 320/128 |
| 2007/0103113 | A1* | 5/2007 | Embrey .............. | H02J 7/0011 320/112 |
| 2007/0139006 | A1* | 6/2007 | Yasuhito ............. | H01M 10/441 320/116 |
| 2007/0183195 | A1 | 8/2007 | Ooishi et al. | |
| 2007/0268000 | A1* | 11/2007 | Kobayashi ........... | H02J 7/0019 320/118 |
| 2007/0285054 | A1 | 12/2007 | Li et al. | |
| 2008/0180106 | A1* | 7/2008 | Gorbold ............. | G01R 31/3658 324/434 |
| 2008/0185995 | A1* | 8/2008 | Carrier .............. | H01M 10/4257 320/134 |
| 2008/0219337 | A1* | 9/2008 | Kawata ............... | B60L 11/1868 375/225 |
| 2008/0284375 | A1* | 11/2008 | Nagaoka ............. | B60L 11/1855 320/116 |
| 2009/0243621 | A1* | 10/2009 | Kudo ................. | G01R 19/0084 324/426 |
| 2010/0244847 | A1* | 9/2010 | Kudo .................... | B60L 3/0046 324/433 |
| 2010/0271036 | A1* | 10/2010 | Kishimoto ............ | H01M 2/206 324/434 |
| 2010/0286938 | A1* | 11/2010 | Kaneko ............... | H01M 10/441 702/63 |
| 2010/0321026 | A1* | 12/2010 | Matsuura ........... | G01R 31/3658 324/434 |
| 2011/0074354 | A1* | 3/2011 | Yano ................. | H01M 10/441 320/116 |
| 2011/0127964 | A1* | 6/2011 | Nishida ................ | H01M 10/44 320/118 |
| 2011/0193413 | A1* | 8/2011 | Kudo .................... | H02J 7/0018 307/77 |
| 2011/0298424 | A1* | 12/2011 | Yamauchi ............. | B60L 3/0046 320/118 |
| 2012/0025769 | A1* | 2/2012 | Kikuchi ................ | B60L 3/0046 320/118 |
| 2012/0187908 | A1* | 7/2012 | Tanigawa ......... | G01R 19/16542 320/116 |
| 2012/0194199 | A1* | 8/2012 | Mizoguchi ........... | G01R 31/396 324/433 |
| 2013/0113290 | A1* | 5/2013 | Sato ....................... | B60L 3/0046 307/80 |
| 2013/0300371 | A1* | 11/2013 | Bills ..................... | H02J 7/0016 320/118 |
| 2014/0152261 | A1 | 6/2014 | Yamauchi et al. | |
| 2014/0186665 | A1* | 7/2014 | Takeyama ............. | H01M 10/48 429/61 |
| 2014/0302352 | A1* | 10/2014 | Lenz ................. | H01M 10/6551 429/7 |
| 2015/0077059 | A1* | 3/2015 | Morikawa ............ | H02J 7/0052 320/116 |

FOREIGN PATENT DOCUMENTS

| | | | |
|---|---|---|---|
| EP | 2574494 A2 | 4/2013 | |
| JP | 2009-236711 A | 10/2009 | |
| JP | 2010-011631 A | 1/2010 | |
| JP | 2010-145128 A | 7/2010 | |
| JP | 2010-228523 A | 10/2010 | |
| JP | 2011-041422 A | 2/2011 | |
| WO | 2012164761 A1 | 12/2012 | |
| WO | WO-2012164761 A1 * | 12/2012 | .......... B60L 11/1866 |
| WO | 2013046978 A1 | 4/2013 | |

* cited by examiner

BATTERY MONITORING DEVICE AND BATTERY SYSTEM USING SAME

TECHNICAL FIELD

The present invention relates to a battery monitoring device and a battery system using the same.

BACKGROUND ART

A secondary battery such as a lithium-ion battery and a nickel-hydrogen battery can be used repetitively by charging the discharged secondary battery. Since the secondary battery has limited voltage values of a charging mode and a discharging mode according to a composition of the secondary battery, it is necessary to perform charging and discharging while monitoring a voltage of the secondary battery.

In addition, a vehicle such as an electric vehicle (EV) and a hybrid electric vehicle (HEV) uses a battery pack formed by connecting a plurality of secondary batteries in series or in parallel, to obtain a necessary power-supply voltage. In the vehicle, if a high voltage of the battery pack short-circuits with a chassis ground of the vehicle, a worker may receive an electric shock. For this reason, a total voltage of the entire battery pack is monitored by a total voltage detecting circuit in which an input and an output are insulated from each other.

Conventional technologies for monitoring the voltages of the individual batteries and the total voltage of the battery pack at the same time are disclosed in PTL 1 and PTL 2.

A total voltage detecting circuit of a battery pack and a battery system for a vehicle disclosed in PTL 1 and PTL 2 are devices on which integrated circuits to monitor voltages of individual battery cells forming the battery pack and a control circuit (microcomputer) to detect a total voltage of the battery pack and control the integrated circuits are mounted.

CITATION LIST

Patent Literatures

PTL 1: JP 2009-236711 A
PTL 2: JP 2010-228523 A

SUMMARY OF INVENTION

Technical Problem

According to the total voltage detecting circuit of the battery pack and the battery system for the vehicle disclosed in PTL 1 and PTL 2, a differential amplifying circuit to measure a voltage divided by a division resistor and a discharging circuit to discharge the battery cells are provided, so that reliability of the total voltage detecting circuit and the battery system for the vehicle can be improved.

However, in the total voltage detecting circuit and the battery system for the vehicle disclosed in PTL 1 and PTL 2, the integrated circuits and the control circuit to control the integrated circuits are arranged on different substrates, respectively, and when there is a short circuit in a connection line connecting the substrates having the integrated circuits mounted thereon and the substrate having the control circuit mounted thereon or a connection line connecting the substrates having the integrated circuits mounted thereon, due to a certain reason, there is a problem in that a large current flows to individual battery cells.

The invention has been made in view of the above problem and an object of the invention is to provide a battery monitoring device capable of suppressing a current flowing to individual battery cells and enhancing the safety thereof, even when there is a short circuit in a connection line connecting substrates having integrated circuits mounted thereon and a substrate having a control circuit mounted thereon or a connection line connecting the substrates having the integrated circuits mounted thereon, and a battery system using the same.

Solution to Problem

To achieve the above object, a battery monitoring device according to the present invention is a battery monitoring device for monitoring a battery pack group formed by electrically connecting a plurality of battery packs, including: a plurality of cell monitoring circuit boards on which first voltage detecting circuits to detect voltages of individual battery cells forming the battery packs are mounted, respectively; and a battery monitoring circuit board on which a second voltage detecting circuit to detect a total voltage of the battery pack group is mounted, wherein a total voltage detecting unit connected to a positive electrode side and a negative electrode side of the battery pack group is connected to the second voltage detecting circuit, at least one resistor is provided in a positive electrode input line to connect the positive electrode side of the battery pack group and the total voltage detecting unit and/or a negative electrode input line to connect the negative electrode side of the battery pack group and the total voltage detecting unit, and the resistor of the positive electrode input line and/or the negative electrode input line is arranged on at least one of the plurality of cell monitoring circuit boards.

In addition, a battery system according to the present invention includes: the battery monitoring device; and a battery pack group including a plurality of battery packs connected to individual cell monitoring circuit boards of the battery monitoring device.

Advantageous Effects of Invention

According to the invention, resistors provided in a positive electrode input line to input a highest potential of a battery pack group to a battery monitoring circuit board and/or a negative electrode input line to input a lowest potential of the battery pack group to the battery monitoring circuit board are arranged to be distributed to at least one of a plurality cell monitoring circuit boards. As a result, even when there is a short circuit in a connection line connecting the cell monitoring circuit boards having first voltage detecting circuits mounted thereon and the battery monitoring circuit board having a second voltage detecting circuit mounted thereon or a connection line connecting the cell monitoring circuit boards having the first voltage detecting circuits mounted thereon, a current flowing to individual battery cells can be suppressed and a worker can safely handle a battery system.

Other objects, configurations, and effects will become more apparent from the following description of embodiments.

DESCRIPTION OF EMBODIMENTS

Hereinafter, embodiments of a battery monitoring device and a battery system using the same according to the present invention will be described with reference to the drawings.

First Embodiment

Figure 1:
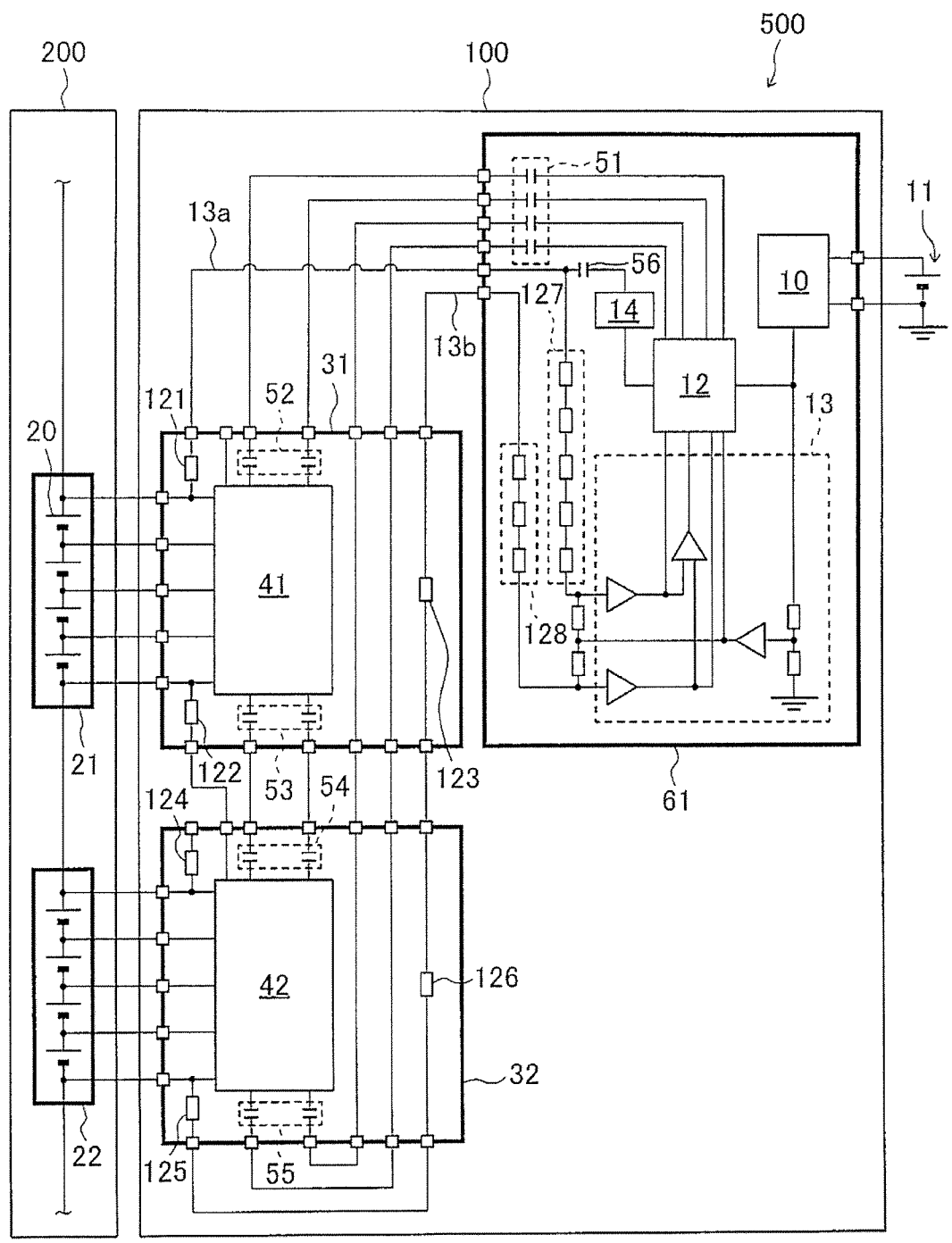
FIG. 1 is an entire configuration diagram illustrating an entire configuration of a first embodiment of a battery monitoring device and a battery system using the same according to the present invention.

FIG. 1 illustrates an entire configuration of a first embodiment of a battery monitoring device and a battery system using the same according to the present invention.

A battery system 500 illustrated in the drawings mainly includes a battery pack group 200 that is formed by electrically connecting a plurality of battery packs 21 and 22 in series and a battery monitoring device 100 that monitors the battery pack group 200.

Each of the battery packs 21 and 22 configuring the battery pack group 200 is formed by connecting a plurality of battery cells 20 in series. As the battery cell 20, a lithium-ion battery, a nickel-hydrogen battery, a nickel-cadmium battery, a lead battery, and a capacitor are exemplified.

The battery monitoring device 100 monitors a total voltage and a total current of the battery pack group 200, voltages and currents of the individual battery packs 21 and 22 configuring the battery pack group 200, voltages, currents, and temperatures of the individual battery cells 20 forming the battery packs 21 and 22, and charging states and degradation states of the individual battery cells 20 based on the voltages, currents, and the temperatures. The battery monitoring device 100 mainly includes a plurality of cell monitoring circuit boards 31 and 32 that are connected to the individual battery packs 21 and 22 and a host control circuit board (battery monitoring circuit board) 61 that controls the individual cell monitoring circuit boards 31 and 32.

The cell monitoring circuit boards 31 and 32 mainly have integrated circuits (first voltage detecting circuits) 41 and 42 for cell monitoring to monitor the individual battery cells 20 forming the battery packs 21 and 22 and capacitors 52 and 53 and 54 and 55 for communication functioning as communication interfaces with a microcomputer (second voltage detecting circuit) 12 of the host control circuit board 61 and the other cell monitoring circuit boards and connected in series, respectively.

The integrated circuits 41 and 42 detect voltages of the individual battery cells 20 of the battery packs 21 and 22 connected to the integrated circuits 41 and 42, on the basis of command signals transmitted from the microcomputer 12 of the host control circuit board 61, and transmit a detection result to the outside.

The host control circuit board 61 mainly has a power supply unit 10, a microcomputer 12, a total voltage detecting unit 13, and capacitors 51 for communication functioning as communication interfaces with the individual cell monitoring circuit boards 31 and 32 and connected in series.

The power supply unit 10 generates a voltage by power supply from a lead storage capacitor 11 provided outside and each circuit configuring the battery monitoring device 100 is operated by the voltage generated by the power supply unit 10.

When the voltages of the individual battery cells 20 are measured, as described above, the microcomputer 12 transmits command signals to the integrated circuits 41 and 42 mounted on the individual cell monitoring circuit boards 31 and 32 via the capacitors 51 for the communication and the integrated circuits 41 and 42 measure the voltages of the individual battery cells 20 of the battery packs 21 and 22 connected to the integrated circuits 41 and 42, on the basis of the command signals. The measured voltage values of the individual battery cells 20 are temporarily stored in registers (not illustrated in the drawings) provided in the integrated circuits 41 and 42 and the microcomputer 12 reads the measured voltage values of the individual battery cells 20 from the registers and acquires the voltage values by communication.

As illustrated in the drawings, communication lines to connect the host control circuit board 61 and the individual cell monitoring circuit boards 31 and 32 are connected to the outside of the individual circuit boards via the capacitors 51 to 55 for the communication mounted on the host control circuit board 61 and the individual cell monitoring circuit boards 31 and 32. For this reason, the communication lines of the outside of the individual circuit boards are at a floating potential from the battery pack group 200 and the lead storage capacitor 11.

Meanwhile, when the total voltage of the battery pack group 200 is measured, the microcomputer 12 acquires potentials of positive and negative electrode sides of the battery pack group 200 via the total voltage detecting unit 13 including a predetermined circuit configuration connected to the microcomputer 12 and measures the total voltage of the battery pack group 200 by an A/D converter (not illustrated in the drawings) provided in the microcomputer 12.

Specifically, the positive electrode side of the battery pack group 200 is input to the host control circuit board 61 via a total voltage detecting resistor 121 mounted on the cell monitoring circuit board 31 and is connected to an input unit of the total voltage detecting unit 13 via a resistor group (for example, five resistors) 127. In addition, the negative electrode side of the battery pack group 200 is input to the host control circuit board 61 via total voltage detecting resistors 125 and 126 mounted on the cell monitoring circuit board 32 and a total voltage detecting resistor 123 mounted on the cell monitoring circuit board 31 and is connected to the input unit of the total voltage detecting unit 13 via a resistor group (for example, three resistors) 128. That is, the positive electrode side of the battery pack group 200 is connected to the input unit of the total voltage detecting unit 13 via a positive electrode input line 13a (also referred to as a positive electrode input circuit) and is connected to the input unit of the total voltage detecting unit 13 via a negative electrode input line (also referred to as a negative electrode input circuit) 13b. The positive electrode input line 13a is provided with a positive electrode resistor including the total voltage detecting resistor 121 mounted on the cell monitoring circuit board 31 and the resistor group 127 mounted on the host control circuit board 61 and the negative electrode input line 13b is provided with a negative electrode resistor including the total voltage detecting resistors 125 and 126 mounted on the cell monitoring circuit board 32, the total voltage detecting resistor 123 mounted on the cell monitoring circuit board 31, and the resistor group 128 mounted on the host control circuit board 61.

The positive electrode input line 13a and the negative electrode input line 13b are input to the total voltage detecting unit 13 of the host control circuit board 61, in a state in which a voltage is equally divided by the plurality of resistors mounted on the cell monitoring circuit boards 31 and 32 and the plurality of resistors mounted on the host control circuit board 61, on each line. The microcomputer 12 acquires the potentials of the positive and negative electrode sides of the battery pack group 200 via the positive electrode input line 13a and the negative electrode input line 13b and the total voltage detecting unit 13, so that the microcomputer 12 can measure the total voltage of the battery pack group 200.

Here, the total voltage detecting resistors provided in the positive electrode input line 13a and the negative electrode input line 13b to measure the total voltage of the battery pack group 200, particularly, the total voltage detecting resistors 123 and 126 provided in the negative electrode input line 13b are arranged to be distributed to the individual cell monitoring circuit boards 31 and 32. As a result, even when there is a short circuit in a connection line connecting the cell monitoring circuit boards 31 and 32 having the integrated circuits 41 and 42 mounted thereon and the host control circuit board 61 having the microcomputer 12 mounted thereon or a connection line connecting the cell monitoring circuit boards 31 and 32 having the integrated circuits 41 and 42 mounted thereon, due to a certain reason, a current flowing to the individual battery cells 20 can be suppressed by the total voltage detecting resistors 123 and 126 mounted on the individual cell monitoring circuit boards 31 and 32.

As illustrated in the drawings, a total voltage detecting resistor 122 connected to the negative electrode side of the battery pack 21 and a total voltage detecting resistor 124 connected to the positive electrode side of the battery pack 22 are mounted on the cell monitoring circuit boards 31 and 32, respectively, to improve versatility of the cell monitoring circuit boards, as described below on the basis of FIG. 2. That is, an insulating element functioning as a communication interface is not mounted on the cell monitoring circuit boards 31 and 32 and each of the cell monitoring circuit boards 31 and 32 has the same circuit configuration. Therefore, various battery systems can be formed simply by connecting a plurality of cell monitoring circuit boards in series.

In addition, an earth detecting unit 14 to detect an insulation decrease between the microcomputer 12 of the host control circuit board 61 and the integrated circuits 41 and 42 of the cell monitoring circuit boards 31 and 32 is mounted on the host control circuit board 61 and the earth detecting unit 14 is connected to the positive electrode input line 13a via a capacitor 56. In addition, the earth detecting unit 14 may be connected to the negative electrode input line 13b via the capacitor 56.

As such, in the first embodiment, the total voltage detecting resistors 123 and 126 provided in the negative electrode input line 13b connecting the negative electrode side of the battery pack group 200 and the total voltage detecting unit 13 of the host control circuit board 61 are arranged to be distributed to at least one of the cell monitoring circuit boards, particularly, the cell monitoring circuit boards 31 and 32. As a result, even when there is a short circuit in the connection line connecting the cell monitoring circuit boards 31 and 32 having the integrated circuits 41 and 42 mounted thereon and the host control circuit board 61 having the microcomputer 12 mounted thereon or the connection line connecting the cell monitoring circuit boards 31 and 32 having the integrated circuits 41 and 42 mounted thereon, a current flowing to the individual battery cells 20 can be suppressed and the worker can safely handle the battery system 500.

In addition, in the first embodiment, the number of resistors mounted on the host control circuit board 61 is adjusted such that the number of resistors provided in the positive electrode input line 13a and the negative electrode input line 13b becomes the same. However, in the case of a circuit in which a value of a voltage input to the total voltage detecting unit 13 is at the same division ratio at the positive electrode side and the negative electrode side of the battery pack group 200, the number of resistors provided in the positive electrode input line 13a and the negative electrode input line 13b may be different.

In addition, in the first embodiment, the configuration in which the signal output from the cell monitoring circuit board 32 is input again to the cell monitoring circuit board 32 via a loop-back path of the outside thereof is used. However, the loop-back path of the outside of the cell monitoring circuit board 32 may be omitted and the loop-back path may be formed in the cell monitoring circuit board 32 by mounting selection of the components.

Second Embodiment

Figure 2:
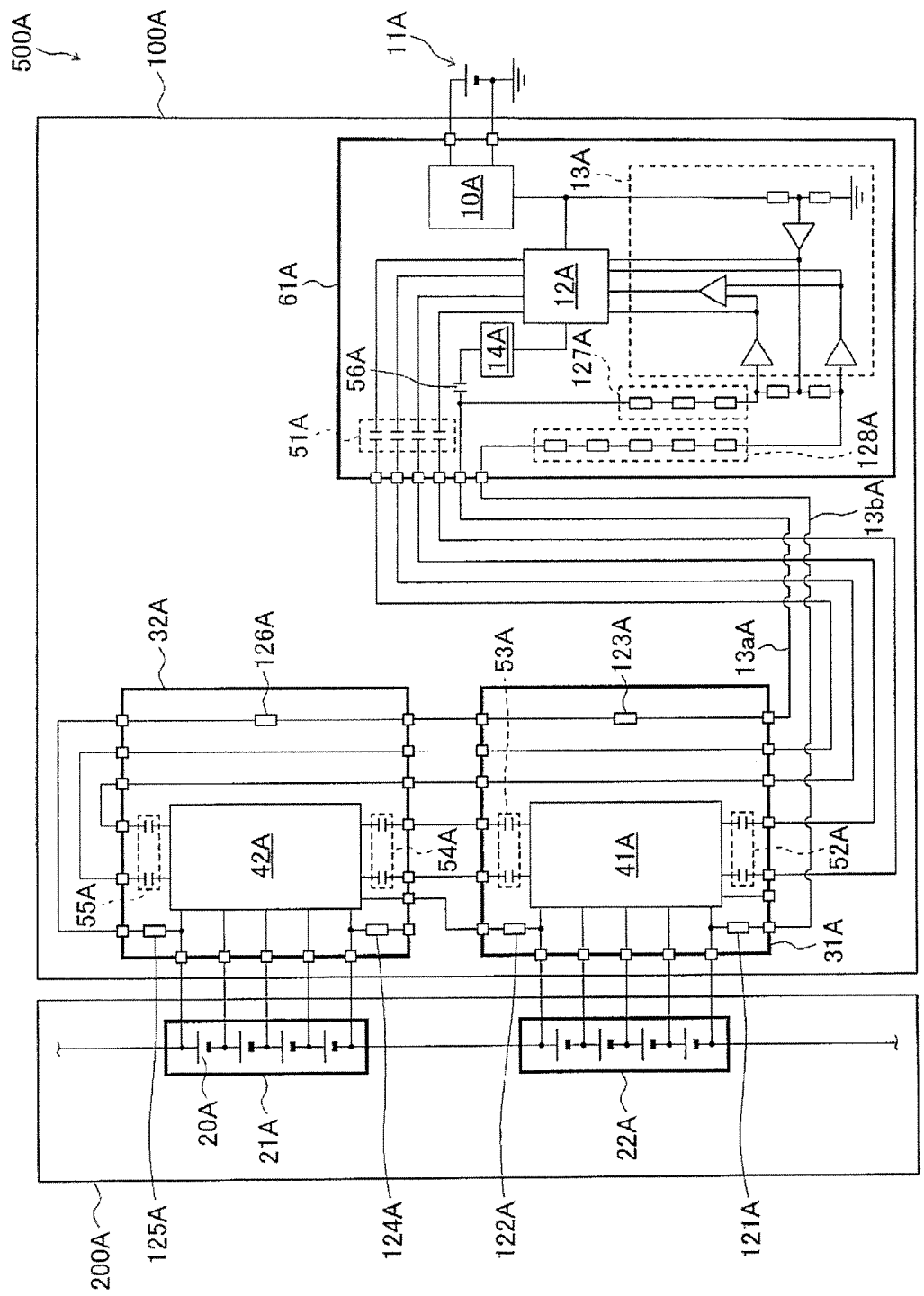
FIG. 2 is an entire configuration diagram illustrating an entire configuration of a second embodiment of a battery monitoring device and a battery system using the same according to the present invention.

FIG. 2 illustrates an entire configuration of a second embodiment of a battery monitoring device and a battery system using the same according to the present invention. A battery monitoring device 100A and a battery system 500A using the same according to the second embodiment illustrated in FIG. 2 are different from the battery monitoring device and the battery system according to the first embodiment in that total voltage detecting resistors provided in a positive electrode input line are distributed and arranged and the other configurations thereof are almost the same as the configurations in the first embodiment. Therefore, the same configurations as the configurations of the first embodiment are denoted with the same reference numerals and detailed description thereof is omitted.

As described above, since individual cell monitoring circuit boards of the battery monitoring device 100A have the same circuit configuration, various battery systems can be formed simply by connecting a connection form of the individual cell monitoring circuit boards.

In the second embodiment, a cell monitoring circuit board 32A is connected to an upper battery pack 21A of a battery pack group 200A and a cell monitoring circuit board 31A is connected to a lower battery pack 22A of the battery pack group 200A.

When voltages of individual battery cells 20A are measured, a microcomputer 12A mounted on a host control circuit board 61A transmits command signals to integrated circuits 41A and 42A mounted on the individual cell monitoring circuit boards 31A and 32A via capacitors 51A for communication and the integrated circuits 41A and 42A measure the voltages of the individual battery cells 20A of the battery packs 22A and 21A connected to the integrated circuits 41A and 42A, on the basis of the command signals. The measured voltage values of the individual battery cells 20A are temporarily stored in registers (not illustrated in the drawings) provided in the integrated circuits 41A and 42A and the microcomputer 12A reads the measured voltage values of the individual battery cells 20A from the registers and acquires the voltage values by communication.

In addition, in the second embodiment, as illustrated in FIG. 2, a positive electrode side of the battery pack group 200A is input to the host control circuit board 61A via total voltage detecting resistor 125A and 126A mounted on the cell monitoring circuit board 32A and a total voltage detecting resistor 123A mounted on the cell monitoring circuit board 31A and is connected to an input unit of a total voltage detecting unit 13A via a resistor group (for example, three resistors) 127A. In addition, a negative electrode side of the battery pack group 200A is input to the host control circuit board 61A via a total voltage detecting resistor 121A mounted on the cell monitoring circuit board 31A and is connected to the input unit of the total voltage detecting unit 13A via a resistor group (for example, five resistors) 128A. That is, the positive electrode side of the battery pack group 200A is connected to the input unit of the total voltage detecting unit 13A via a positive electrode input line 13aA (also referred to as a positive electrode input circuit) and the negative electrode side of the battery pack group 200A is connected to the input unit of the total voltage detecting unit 13A via a negative electrode input line 13bA (also referred to as a negative electrode input circuit). The positive electrode input line 13aA is provided with a positive electrode resistor including the total voltage detecting resistors 125A and 126A mounted on the cell monitoring circuit board 32A, the total voltage detecting resistor 123A mounted on the cell monitoring circuit board 31A, and the resistor group 127A mounted on the host control circuit board 61A and the negative electrode input line 13bA is provided with a negative electrode resistor including the total voltage detecting resistor 121A mounted on the cell monitoring circuit board 31A and the resistor group 128A mounted on the host control circuit board 61A.

The positive electrode input line 13aA and the negative electrode input line 13bA are input to the total voltage detecting unit 13A of the host control circuit board 61A, in a state in which a voltage is equally divided by the plurality of resistors mounted on the cell monitoring circuit boards 31A and 32A and the plurality of resistors mounted on the host control circuit board 61A, on each line. The microcomputer 12A acquires the potentials of the positive and negative electrode sides of the battery pack group 200A via the positive electrode input line 13aA and the negative electrode input line 13bA and the total voltage detecting unit 13A, so that the microcomputer 12A can measure the total voltage of the battery pack group 200A.

Here, in the second embodiment, the total voltage detecting resistors provided in the positive electrode input line 13aA and the negative electrode input line 13bA to measure the total voltage of the battery pack group 200A, particularly, the total voltage detecting resistors 123A and 126A provided in the positive electrode input line 13aA are arranged to be distributed to the individual cell monitoring circuit boards 31A and 32A. As a result, even when there is a short circuit in a connection line connecting the cell monitoring circuit boards 31A and 32A having the integrated circuits 41A and 42A mounted thereon and the host control circuit board 61A having the microcomputer 12A mounted thereon or a connection line connecting the cell monitoring circuit boards 31A and 32A having the integrated circuits 41A and 42A mounted thereon, due to a certain reason, a current flowing to the individual battery cells 20A can be suppressed by the total voltage detecting resistors 123A and 126A mounted on the individual cell monitoring circuit boards 31A and 32A and a worker can safely handle the battery system 500A.

Third Embodiment

Figure 3:
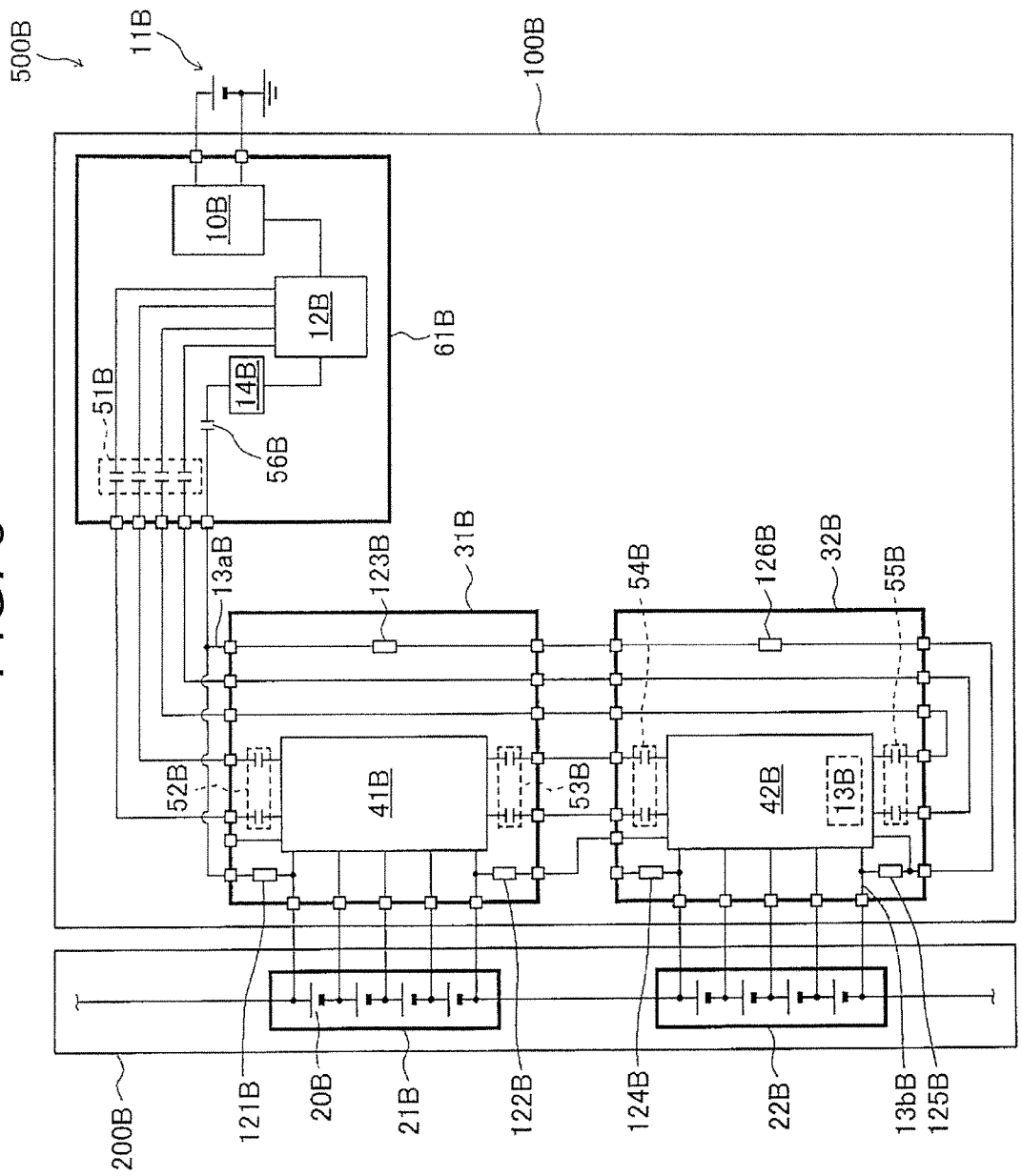
FIG. 3 is an entire configuration diagram illustrating an entire configuration of a third embodiment of a battery monitoring device and a battery system using the same according to the present invention.

FIG. 3 illustrates an entire configuration of a third embodiment of a battery monitoring device and a battery system using the same according to the present invention. A battery monitoring device 100B and a battery system 500B using the same according to the third embodiment illustrated in FIG. 3 are different from the battery monitoring devices and the battery systems according to the first and second embodiments in that a total voltage of a battery pack group is detected using one integrated circuit selected from a plurality of integrated circuits for cell monitoring and the other configurations thereof are almost the same as the configurations in the first and second embodiments. Therefore, the same configurations as the configurations of the first and second embodiments are denoted with the same reference numerals and detailed description thereof is omitted.

In the third embodiment, to increase a communication speed of a total voltage of a battery pack group 200B, a total voltage detecting unit 13B to measure a total voltage of the battery pack group 200B is provided in an integrated circuit 42B of a cell monitoring circuit board 32B for battery monitoring selected from a plurality of cell monitoring circuit boards 31B and 32B and the total voltage of the battery pack group 200B is measured by the integrated circuit 42B of the cell monitoring circuit board 32B for the battery monitoring.

As illustrated in FIG. 3, the battery monitoring device 100B mainly includes the plurality of cell monitoring circuit boards 31B and 32B (as described below, the cell monitoring circuit board 32B also functions as a battery monitoring circuit board to detect the total voltage of the battery pack group 200B) connected to individual battery packs 21B and 22B and a host control circuit board 61B to control the individual cell monitoring circuit boards 31B and 32B.

The cell monitoring circuit boards 31B and 32B mainly include integrated circuits (first voltage detecting circuits) 41B and 42B for cell monitoring (as described below, the integrated circuit 42B also functions as a second voltage detecting circuit) monitoring individual battery cells 20B forming the battery packs 21B and 22B and capacitors 52B and 53B and 54B and 55B for communication functioning as communication interfaces with a microcomputer 12B of the host control circuit board 61B or the other cell monitoring circuit boards and connected in series, respectively.

The integrated circuits 41B and 42B detect voltages of the individual battery cells 20B of the battery packs 21B and 22B connected to the integrated circuits 41B and 42B, on the basis of command signals transmitted from the microcomputer 12B of the host control circuit board 61B, and transmit a detection result to the outside.

The host control circuit board 61B mainly has a power supply unit 10B, a microcomputer 12B, and capacitors 51B for communication functioning as communication interfaces with the cell monitoring circuit boards 31B and 32B and connected in series.

When voltages of the individual battery cells 20B are measured, as described above, the microcomputer 12B transmits command signals to the integrated circuits 41B and 42B mounted on the individual cell monitoring circuit boards 31B and 32B via the capacitors 51B for the communication and the integrated circuits 41B and 42B measure the voltages of the individual battery cells 20B of the battery packs 21B and 22B connected to the integrated circuits 41B and 42B, on the basis of the command signals. The measured voltage values of the individual battery cells 20B are temporarily stored in registers (not illustrated in the drawings) provided in the integrated circuits 41B and 42B and the microcomputer 12B reads the measured voltage values of the individual battery cells 20B from the registers and acquires the voltage values by communication.

Meanwhile, when the total voltage of the battery pack group 200B is measured, the integrated circuit 42B (second voltage detecting circuit) of the cell monitoring circuit board (battery monitoring circuit board) 32B monitoring the battery cell having the lowest potential among the battery cells 20 of the battery pack group 200B acquires potentials of positive and negative electrode sides of the battery pack group 200B via a total voltage detecting unit 13B including a predetermined circuit configuration provided inside and measures the total voltage of the battery pack group 200B by an A/D converter (not illustrated in the drawings) provided in the integrated circuit 42B.

Specifically, a voltage of the positive electrode side of the battery pack group 200B is divided by total voltage detecting resistors 121B and 123B mounted on the cell monitoring circuit board 31B and total voltage detecting resistors 126B and 125B mounted on the cell monitoring circuit board 32B and the positive electrode side is connected to an input unit of the total voltage detecting unit 13B of the integrated circuit 42B. In addition, the negative electrode side of the battery pack group 200B is connected directly to the input unit of the total voltage detecting unit 13B of the integrated circuit 42B. That is, the positive electrode side of the battery pack group 200B is connected to the input unit of the total voltage detecting unit 13B via a positive electrode input line 13aB (also referred to as a positive electrode input circuit) and the negative electrode side of the battery pack group 200B is connected to the input unit of the total voltage detecting unit 13B via a negative electrode input signal 13bB. The positive electrode input line 13aB is provided with a positive electrode resistor including the total voltage detecting resistors 121B and 123B mounted on the cell monitoring circuit board 31B and the total voltage detecting resistors 126B and 125B mounted on the cell monitoring circuit board 32B.

The integrated circuit 42B of the cell monitoring circuit board 32B acquires the potentials of the positive and negative electrode sides of the battery pack group 200B via the positive electrode input line 13aB and the negative electrode input line 13bB and the total voltage detecting unit 13B, so that the integrated circuit 42B can measure the total voltage of the battery pack group 200B.

Here, in the third embodiment, the total voltage detecting resistors 123B and 126B provided in the positive electrode input line 13aB to measure the total voltage of the battery pack group 200B are arranged to be distributed to the individual cell monitoring circuit boards 31B and 32B. As a result, even when there is a short circuit in a connection line connecting the cell monitoring circuit boards 31B and 32B having the integrated circuits 41B and 42B mounted thereon, due to a certain reason, a current flowing to the individual battery cells 20B can be suppressed by the total voltage detecting resistors 123B and 126B mounted on the individual cell monitoring circuit boards 31B and 32B.

In addition, in the third embodiment, a configuration in which the potential of the positive electrode side of the battery pack group 200B is temporarily output to the outside of the cell monitoring circuit board 31B and is input again to the cell monitoring circuit board 31B is used. However, the potential of the positive electrode side of the battery pack group 200B may be transmitted to the cell monitoring circuit board 32B via the connection line provided in the cell monitoring circuit board 31B.

As illustrated in the drawings, the negative electrode side of the battery pack 21B may be connected to the integrated circuit 42B of the lower cell monitoring circuit board 32B via the total voltage detecting resistor 122B mounted on the cell monitoring circuit board 31B and may be used for voltage measurement to detect abnormality of a connection state between the battery packs 21B and 22B.

In addition, in the third embodiment, the form in which the total voltage detecting resistors 123B and 126B provided in the positive electrode input line 13aB to measure the total voltage of the battery pack group 200B are arranged to be distributed to the individual cell monitoring circuit boards 31B and 32B has been described. However, a plurality of total voltage detecting resistors may be provided in the negative electrode input line 13bB to connect the negative electrode side of the battery pack group 200B and the total voltage detecting unit 13B and the plurality of total voltage detecting resistors provided in the negative electrode input line 13bB may be arranged to be distributed to the individual cell monitoring circuit boards 31B and 32B.

In addition, in the first to third embodiments, the form in which the plurality of battery packs formed by connecting the plurality of battery cells in series are connected in series and the battery pack group is configured has been described. However, the number and the connection form (serial connection or parallel connection) of battery packs configuring the battery pack group or the number and the connection form (serial connection or parallel connection) of battery cells configuring the battery pack may be appropriately changed according to performance of a necessary battery system.

The present invention is not limited to the first to third embodiments described above and various modifications are included in the present invention. For example, the first to third embodiments are embodiments described in detail to facilitate the description of the present invention and are not limited to embodiments in which all of the described configurations are included. In addition, a part of the configurations of the certain embodiment can be replaced by the configurations of another embodiment and the configurations of another embodiment can be added to the configurations of the certain embodiment. In addition, for a part of the configurations of the individual embodiments, addition, deletion, and replacement of other configurations are enabled.

In addition, a part or all of the individual configurations, functions, processing units, and processing mechanisms may be designed by integrated circuits and may be realized by hardware. In addition, the individual configurations and functions may be realized by software by analyzing programs for realizing the functions by a processor and executing the programs by the processor. Information such as programs, tables, and files for realizing the individual functions may be stored in a recording device such as a memory, a hard disk, and a solid state drive (SSD) or a recording medium such as an IC card, an SD card, and a DVD.

In addition, only control lines or information lines necessary for explanation are illustrated and the control lines or information lines do not mean all control lines or information lines necessary for a product. In actuality, almost all configurations may be connected to each other.

REFERENCE SIGNS LIST

10 power supply unit
11 lead storage battery 12 microcomputer (second voltage detecting circuit)
13 total voltage detecting unit
13a positive electrode input line
13b negative electrode input line
14 earth detecting unit
20 battery cell
21, 22 battery pack
31, 32 cell monitoring circuit board
32B cell monitoring circuit board for battery monitoring (battery monitoring circuit board)
41, 42 integrated circuit for cell monitoring (first voltage detecting circuit)
42B integrated circuit for cell monitoring (second voltage detecting circuit)
51 capacitor for communication in host control circuit board
52, 53, 54, 55 capacitor for communication in cell monitoring circuit board 56 capacitor
61 host control circuit board (battery monitoring circuit board)
100 battery monitoring device
121, 122, 123, 124, 125, 126 total voltage detecting resistor
127, 128 resistor group
200 battery pack group
500 battery system

The invention claimed is:

1. A battery monitoring device for monitoring a battery pack group formed by electrically connecting a plurality of battery packs, comprising:
a plurality of first circuit boards, wherein each respective first circuit board includes:
a first voltage detecting circuit that detects voltages of individual battery cells forming a respective battery pack,
a first capacitor,
a first total voltage resistor connected to a highest potential side of the respective battery pack, and
a second total voltage detecting resistor connected to a lowest potential side of the respective battery pack;
a second voltage detecting circuit that detects a total voltage of the battery pack group, wherein the second voltage detecting circuit:
receives a positive input voltage from the plurality of first circuit boards via the first total voltage detecting resistor of each of the plurality of first circuit boards, wherein the first total voltage detecting resistor of each of the plurality of first circuit boards are connected in series,
receives a negative input voltage from the plurality of first circuit boards via one of the second total voltage detecting resistors, receives a digital input from each of the plurality of first circuit boards via the first capacitor of each of the plurality of first circuit boards, wherein the digital input indicates the voltages of individual battery cells forming the respective battery pack detected, and
detects the total voltage of the battery pack group based on the digital input from each of the plurality of first circuit boards, the positive input voltage and the negative input voltage;
wherein each of the plurality of first circuit boards are at a floating point potential with respect to the plurality of battery packs.

2. The battery monitoring device according to claim 1, further comprising:
a second circuit board that includes the second voltage detecting circuit, wherein the second circuit board includes a second resistor connected between the second voltage detecting circuit and a positive electrode input line that carries the positive input voltage, and a third resistor connected between the second voltage detecting circuit and a negative electrode input line that carries the negative input voltage.

3. A battery monitoring device for monitoring a battery pack group formed by electrically connecting a plurality of battery packs, comprising:
a plurality of cell monitoring circuit boards, wherein each respective cell monitoring circuit board includes:
integrated circuits that detect voltages of individual battery cells forming a respective battery pack,
a first capacitor,
a first total voltage resistor connected to a highest potential side of the respective battery pack, and
a second total voltage detecting resistor connected to a lowest potential side of the respective battery pack;
a microcomputer that detects a total voltage of the battery pack group, wherein the microcomputer:
receives a positive input voltage from the plurality of cell monitoring circuit boards via the first total voltage detecting resistor of each of the plurality of cell monitoring circuit boards, wherein the first total voltage detecting resistor of each of the plurality of cell monitoring circuit boards are connected in series,
receives a negative input voltage from the plurality of cell monitoring circuit boards via one of the second total voltage detecting resistors,
receives a digital input from each of the plurality of cell monitoring circuit boards via the first capacitor of each of the plurality of cell monitoring circuit boards, wherein the digital input indicates the voltages of individual battery cells forming the respective battery pack detected, and
detects the total voltage of the battery pack group based on the digital input from each of the plurality of cell monitoring circuit boards, the positive input voltage and the negative input voltage;
wherein each of the plurality of cell monitoring circuit boards are at a floating point potential with respect to the plurality of battery packs.

4. A battery system, comprising:
a battery pack group formed by electrically connecting a plurality of battery packs;
a plurality of cell monitoring circuit boards, wherein each respective cell monitoring circuit boards includes:
a first voltage detecting circuit that detects voltages of individual battery cells forming a respective battery pack,
a first capacitor,
a first total voltage resistor connected to a highest potential side of the respective battery pack, and
a second total voltage detecting resistor connected to a lowest potential side of the respective battery pack;
a second voltage detecting circuit that detects a total voltage of the battery pack group, wherein the second voltage detecting circuit:
receives a positive input voltage from a the plurality of cell monitoring circuit boards via the first total voltage detecting resistor of each of the plurality of cell monitoring circuit boards, wherein the first total voltage detecting resistor of each of the plurality of cell monitoring circuit boards are connected in series, receives a negative input voltage from the plurality of cell monitoring circuit boards via one of the second total voltage detecting resistors, receives a digital input from each of the plurality of cell monitoring circuit boards via the first capacitor of each of the plurality of cell monitoring circuit boards, wherein the digital input indicates the voltages of individual battery cells forming the respective battery pack detected, and detects the total voltage of the battery pack group based on the digital input from each of the plurality of cell monitoring circuit boards, the positive input voltage and the negative input voltage;

wherein each of the plurality of cell monitoring circuit boards are at a floating point potential with respect to the plurality of battery packs.

* * * * *